United States Patent [19]

Pitts et al.

[11] Patent Number: 4,776,509
[45] Date of Patent: Oct. 11, 1988

[54] SINGLE POINT BONDING METHOD AND APPARATUS

[75] Inventors: Gregory E. Pitts; David E. Boone; Daniel M. Andrews, all of Austin, Tex.

[73] Assignee: Microelectronics and Computer Technology Corporation, Austin, Tex.

[21] Appl. No.: 52,652

[22] Filed: May 19, 1987

[30] Foreign Application Priority Data

Oct. 13, 1986 [GB] United Kingdom ............... 8624513

[51] Int. Cl.$^4$ .......................................... B23K 31/02
[52] U.S. Cl. ................................. 228/179; 228/1.1; 228/54; 228/56.2
[58] Field of Search ............... 228/179, 11.1, 54, 55, 228/1.1, 56.2, 44.7

[56] References Cited

U.S. PATENT DOCUMENTS

| | | | |
|---|---|---|---|
| 3,822,465 | 7/1974 | Frankfort et al. | 228/1.1 |
| 3,917,146 | 11/1975 | Culp | 228/1.1 |
| 3,934,783 | 9/1975 | Larrison | 228/1.1 |
| 4,030,657 | 6/1977 | Scheffer | 228/1.1 |

FOREIGN PATENT DOCUMENTS

| | | | |
|---|---|---|---|
| 2818911 | 12/1978 | Fed. Rep. of Germany | 228/54 |
| 0096643 | 7/1980 | Japan | 228/54 |
| 184132 | 12/1958 | Sweden | 228/55 |

Primary Examiner—Nicholas P. Godici
Assistant Examiner—Karen Skillman
Attorney, Agent, or Firm—Fulbright & Jaworski

[57] ABSTRACT

A single point bonding apparatus and method for bonding one electrical conductor to a second electrical conductor by a thermosonic process using force, time, temperature and ultrasonic energy as the key parameters in forming the bonds. A bonding tool has a tip with a multiple of nonparallel surfaces extending from the end of the tip for maximizing the amount of ultrasonic energy coupled to the electrical conductors. The surfaces may be recessed into the end of the tip or protrude outwardly from the end of the tip for coupling ultrasonic energy in directions both parallel and perpendicular to the conductors.

7 Claims, 5 Drawing Sheets

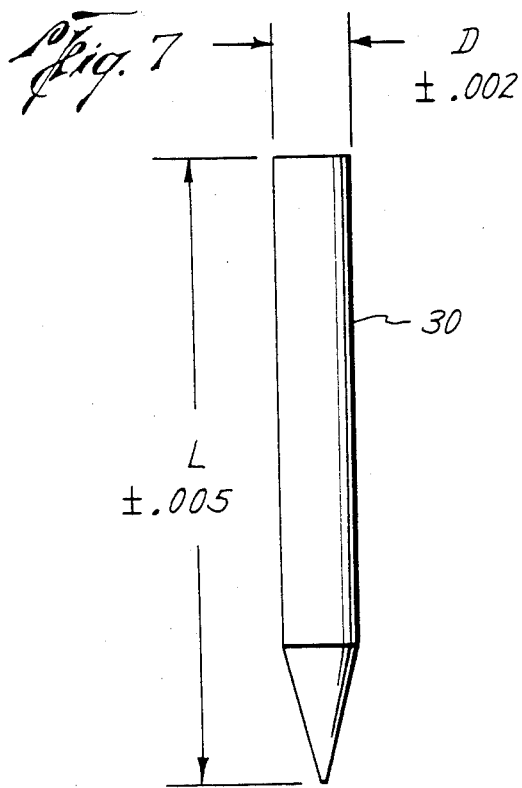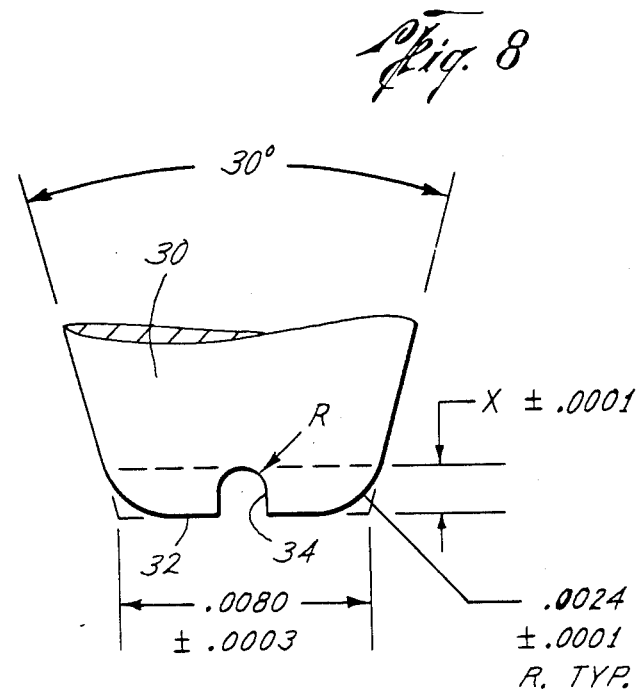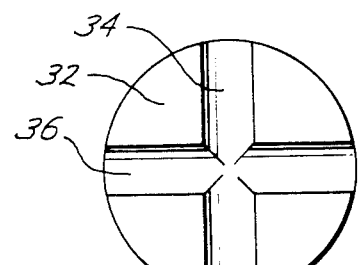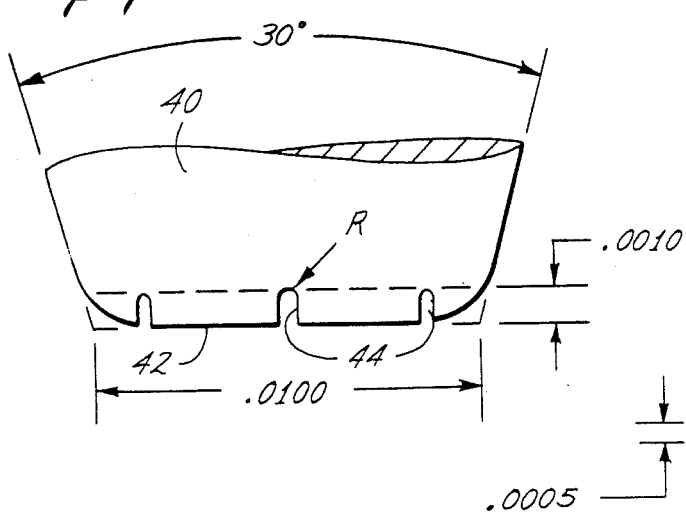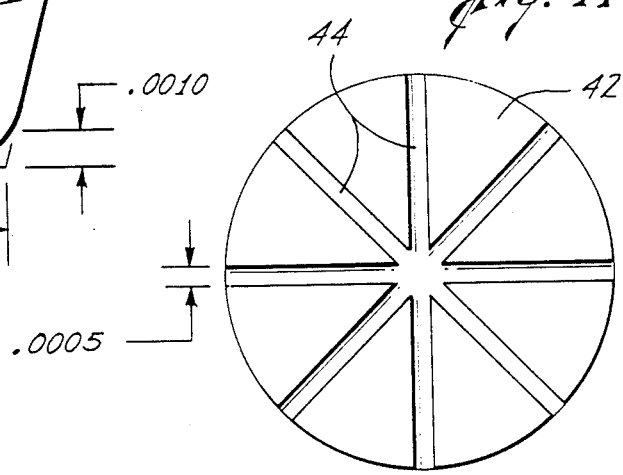

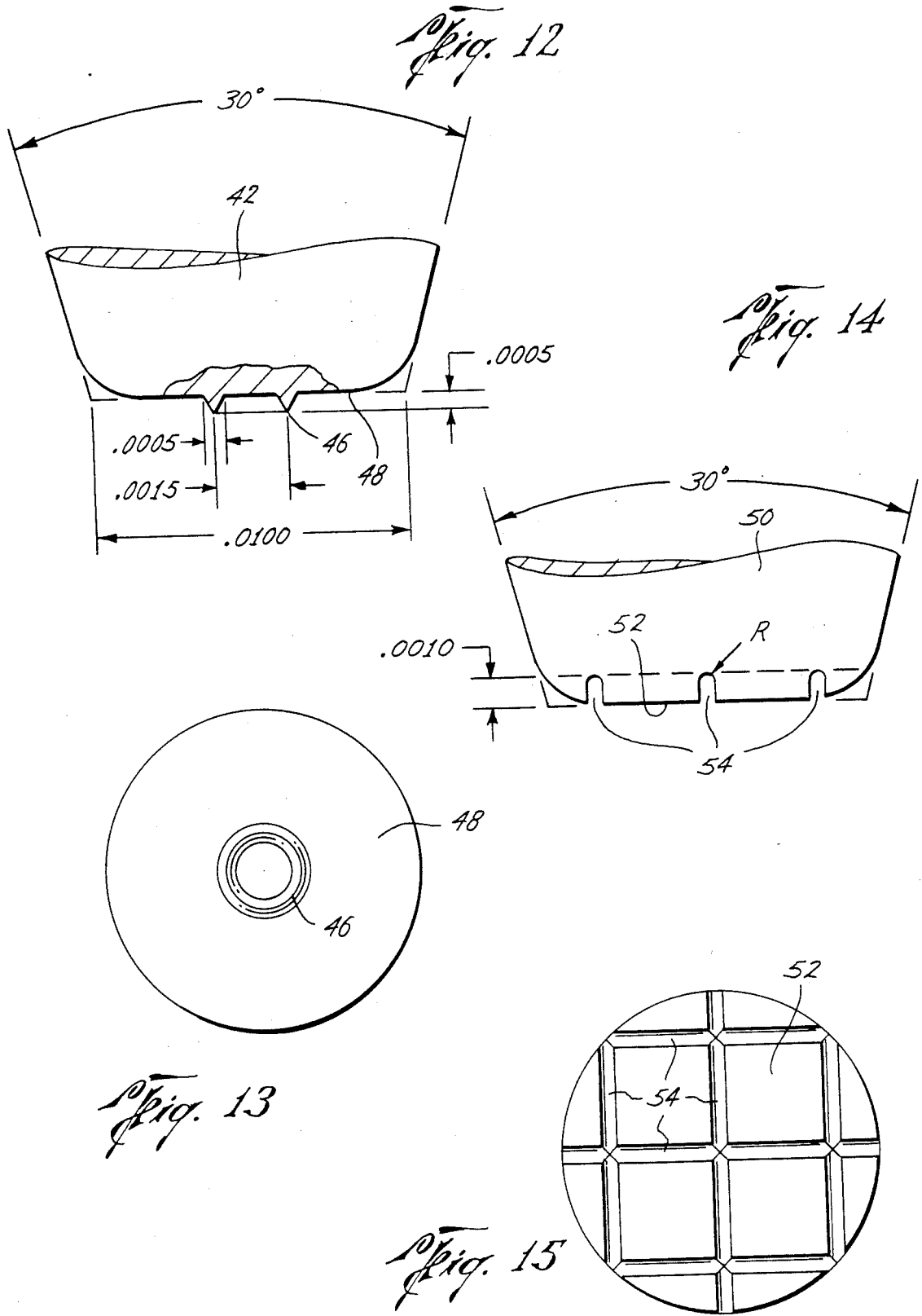

SINGLE POINT BONDING METHOD AND APPARATUS

BACKGROUND OF THE INVENTION

The present invention is directed, in particular, to a bonding process forming reliable intermetallic bonds one at a time between tape automated bonded ("TAB") leads and a suitable substrate or between TAB leads and integrated circuits. The process is thermosonic, using force, time, temperature and ultrasonic energy as the key parameters in forming the bonds. The key to the success of this process is the use of unique bonding tools designed to couple the ultrasonic energy into the lead efficiently and repeatedly.

There are several primary applications for this type of process. By forming the bonds individually with a small bonding tool, the problem of lack of planarity in gang (i.e., simultaneous bonding of a plurality of leads) TAB is eliminated. This is of most importance in outer lead bonding (OLB) of integrated circuit chips, for example, into a ceramic package where it is difficult to maintain sufficient flatness. This process is also useful for inner lead bonding (ILB), particularly for large devices or extremely sensitive devices such a GaAs integrated circuits. Due to the nature of the process, i.e., being single point bonding, it is very adaptable, which makes it desirable for short production runs, R & D work, and incoming material inspections.

One use of the present process is with a typical ceramic package such as a leadless chip carrier or pin grid array where absolute planarity of the package is not guaranteed. This technology is useful as a substitute for wire bonding in high density high lead count packages and in non-solderable environments such as hermetic packages and packages for military applications. Single point bonding is also useful in the repair of gang bonded devices and the assembly of short runs where set up of conventional TAB is not economically feasible.

SUMMARY

The present invention is directed through the improvement in a bonding tool in a bonding machine for bonding one electrical conductor to a second electrical conductor in which the machine includes an ultrasonic generator and means for forcing a tip of a bonding tool into contact with one of the conductors. The improved bonding tool has a tip with a multiple of nonparallel surfaces extending from the end of the tip to maximize the amount of ultrasonic energy coupled to the electrical conductors to be bonded. In addition, the nonparallel surfaces allow the ultrasonic energy to be coupled in both parallel and perpendicular directions relative to the electrical conductors. The surfaces may be recessed into the end of the tip or protrude outwardly from the end of the tip.

Another object of the present invention is wherein the nonparallel surfaces may be of various configurations or patterns such as cross shaped, circular, or a plurality of straight lines which are perpendicular to other straight lines.

Still a further object of the present invention is wherein the depth and width of the surfaces is no greater than substantially 3 mils.

Yet a still further object of the present invention is the use of the single point bonding tool of the present invention in a process for ultrasonically bonding one flat electrical conductor to a second flat electrical conductor for tape automated bonding by placing one of the conductors on the other conductor, forcing the tip into contact with one of the conductors with a tip contact pressure of from about 10 to about 300 grams for a contact time of about 10 milliseconds to about 500 milliseconds and coupling ultrasonic energy of up to 10 watts to the bonding tool, and in which the temperature of the conductors is from about 25° C. up to about 300° C.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 7 is a enlarged elevational view of the preferred embodiment of the present invention, FIG. 8 is an enlarged detailed view of detail A of FIG. 7, FIG. 9 is an end view of the tip of FIG. 8, FIG. 10 is an enlarged fragmentary elevational view of the tip of another embodiment of the present invention, FIG. 11 is an end view of the tip of FIG. 10, FIG. 12 is an enlarged fragmentary elevational view of the end of the tip of another embodiment of the present invention, FIG. 13 is an end view of the tip of FIG. 12, FIG. 14 is an enlarged fragmentary elevational view of the tip of a further embodiment of the present invention, FIG. 15 is an end view of the tip of FIG. 14.

DESCRIPTION OF THE PREFERRED EMBODIMENT

While the present invention will be described in connection with outer lead bonding (OLB) and inner lead bonding (ILB) between tape automated bonded (TAB) leads, for purposes of illustration only, the present process and apparatus are useful in other thermosonic processes for bonding one electrical conductor to a second electrical conductor.

Figure 1:
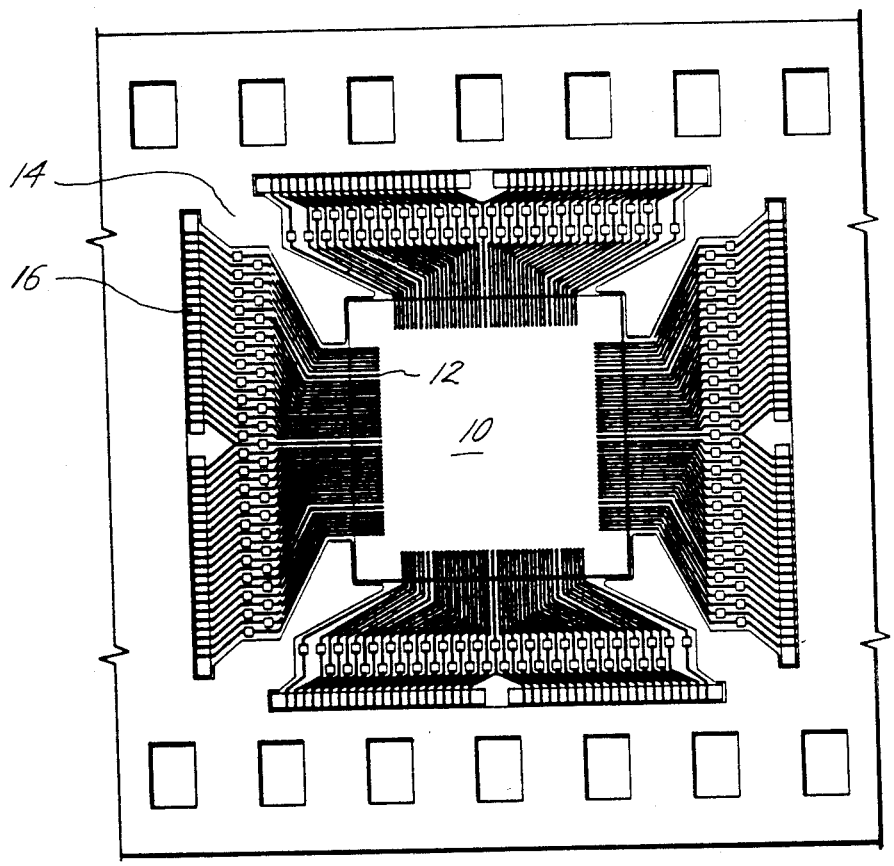
FIG. 1 is an elevational view of an integrated circuit having inner and outer leads.

Referring now to FIG. 1, an integrated circuit or die indicated by the reference numeral 10 which is positioned to engage the plurality of inner leads 12 of a TAB 14 and the outer leads 16 of the TAB 14 are positioned for interconnection to other electrical devices. The present invention is particularly adapted to bonding electrical connections to the inner 12 and the outer 16 leads.

Figure 2:
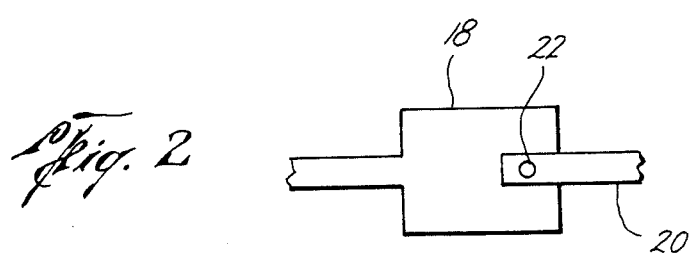
FIG. 2 is an enlarged elevational view illustrating the placement of an electrical conductor or pad to be bonded to another electrical conductor or beam.
Figure 3:
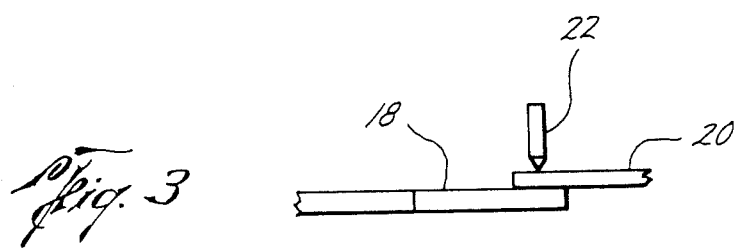
FIG. 3 is a side elevational view of FIG. 2.

Referring now to FIGS. 2 and 3 a pad 18, which may be a gold plated nickel pad is provided which is to be bonded to one or more leads or beams 20 which also may be gold plated copper electrical conductors. As an example, the pads may nominally measure 30 mils by 21 mils and the width of the leads 20 may be 3.5 mils. Of course, other types of materials may be thermosonically bonded such as tin plated copper, silver plated copper, and tin lead solders. Electrical conductors 18 and 20 are positioned together by contacting flat surfaces and thermosonically bonded by a bonding tool 22 which is forced into one of the members 20 by pressing the members together for a predetermined amount of time at a predetermined temperature and ultrasonic energy vibrates the tool 22 to create the bond between the members 18 and 20. Various types of bonding machines are available for actuating the bonding tool 22 such as International Micro Industries Model 1310, Hughes Aircraft Company Model 2460 or K&S 1419.

In actual bonding experiments it was noted that conventional bonding tools were unsatisfactory and revealed inconsistencies in the bonding from one bond to the next. Closer observations showed that in some instances the ultrasonics would scrub away the beam, cause deformation and a squashed effect on the beam 20 while other adjacent bonds did not appear to deform the beams 20 near as much even though the same parameters were used.

Figure 4:
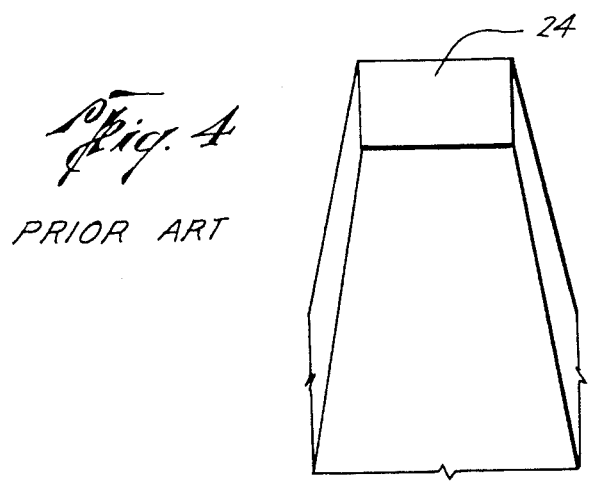
FIG. 4 is an end view of a conventional prior art square smooth tip of a bonding tool.
Figure 5:
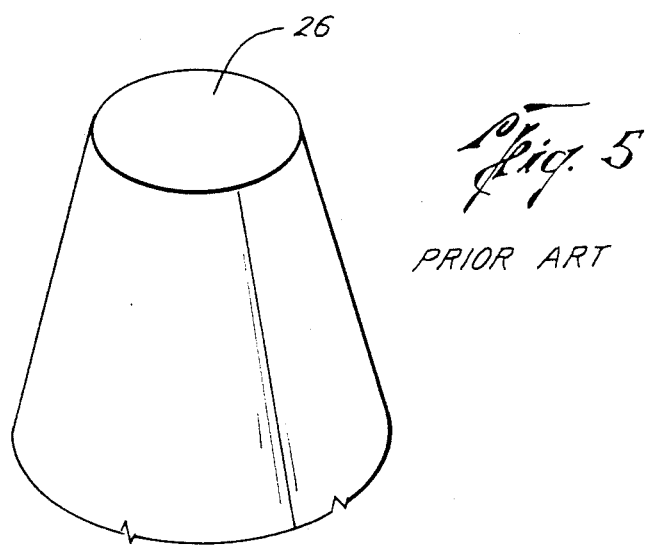
FIG. 5 is a perspective view of the end of a conventional prior art round smooth tip of a bonding tool.

One prior art bonding tool used as best shown in FIG. 4 has a flat tip 24 which was rectangular with a dimension of 15 mils by 10 mils. A second prior art tool (FIG. 5) used has a smooth flat face 26 which was circular in shape with a 5 mil diameter. Another prior art tool 28 (FIG. 6) which was tried was a ceramic bond tip having a flat circular face with a diameter of 2.5 mils with a hole therein of approximately 1.7 mils diameter. The flat tip tools of FIGS. 4 and 5 produced inconsistent results because of their inability to grab the beam 20 and couple the ultrasonic energy to the bond.

Figure 6:
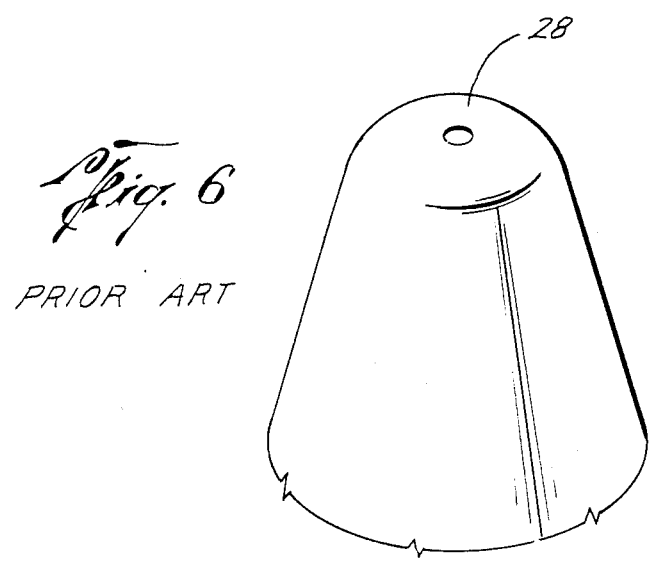
FIG. 6 is a perspective view of the end of a prior art type of ceramic wire bond capillary type bonding tool.

Visual observation and beam pull data of the bonds made with the wire bond ceramic capillary tip 28 of FIG. 6 showed greater uniformity than the bonds made with the smooth tips of the prior art tools 24 and 26. This difference was determined to be the result of the hole in the capillary tip and the matt finish of the ceramic increasing the coupling of the ultrasonic energy over the smooth tip tools. This type of tool is not used for bonding flat electrical conductors, but bond a wire inserted in the hole to another surface.

With the wire bond capillary 28 of FIG. 6, it was found that a displacement of material resulted in a 3 mil (volcano) into the capillary hole. However, all the prior art devices failed on beam pull tests at light loads. Several vendors indicated that single point bonding could be done but that it required larger ultrasonic transducers and large ultrasonic generators and increased force pressure in bonding.

The foregoing problems were largely eliminated by the development of a novel bonding tool fabricated out of tungsten carbide which had a surface configuration or pattern which not only maximized the amount of ultrasonic energy coupled to the beam 20 but coupled the energy in both parallel and perpendicular directions relative to the longitudinal axis of the beam 20 and does not require the TAB of FIG. 1 to be rotated 90° C. for bonding perpendicular sides.

Referring now to FIGS. 7, 8 and 9, the preferred embodiment 30 of the present invention is best seen which has a tip 32 with multiple nonparallel surfaces extending from the end of the tip 32. In the embodiment shown in FIGS. 7-9, the surfaces include grooves 34 and 36 in a cross-pattern or configuration in which the grooves 34 and 36 were perpendicular to each other. It was found that this cross-pattern configuration maximized the coupling of the ultrasonic energy in directions both parallel and perpendicular and did not require the rotation of the substrate or the integrated circuit 10 (FIG. 1) as the leads were bonded. This cross-pattern provided a surface with a greater amount of tip contact, and grabbed the beam 20 instead of sliding thereon as did the prior art tips.

Figure 18:
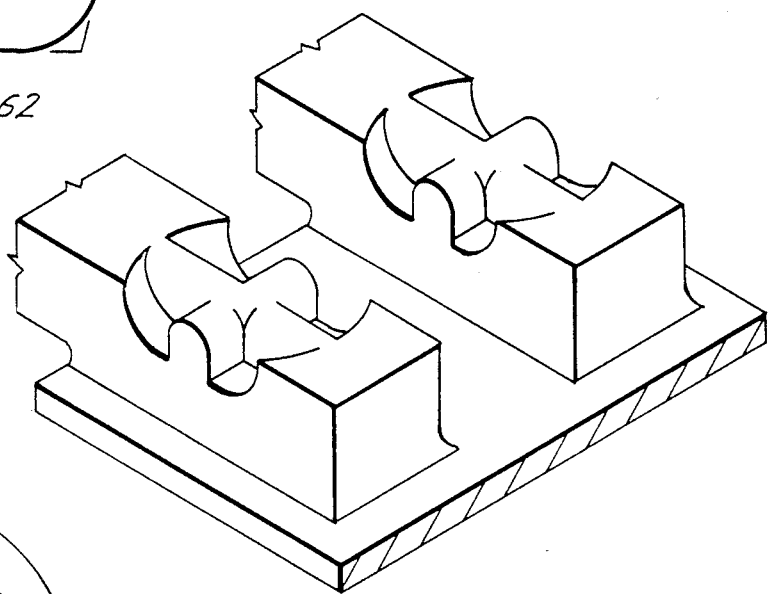
FIG. 18 is an enlarged perspective view of a bonded connection of the outer leads shown in FIGS. 2 and 3 using the bonding tool of FIGS. 7, 8 and 9 with a 1.5 mil deep groove.

In one embodiment of the tool 30 of FIGS. 7-9 the depth and width of the grooves 34 and 36 was 1.5 mils and produced a highly superior bond as best seen in FIG. 18. While it was anticipated that the grooves 34 and 36 with a depth and width of 1.5 mils would force the tip 32 to bottom on the beam 20 as it displaced material, the tool did not bottom but still formed excellent bonds. Initial bond pulls measured frequently over 100 grams and normally greater than 70 grams on OLB bonds and greater than 50 grams on ILB bonds. The pull measurements on the bonds frequently exceeded the tensile strength of the beam 20 and the plating adhesion of the pads 18.

Figure 19:
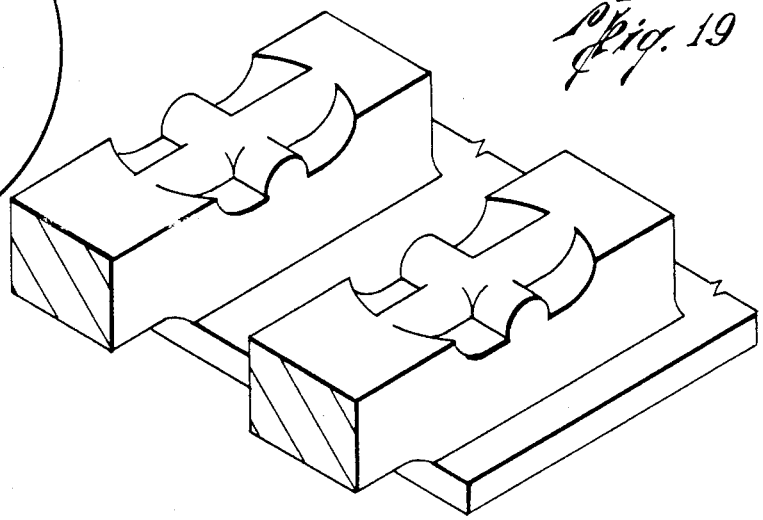
FIG. 19 is a perspective view similar to FIG. 18 using a 1.0 mil deep groove patterned tip of the tool of FIGS. 7, 8 and 9.

Groove depths for the grooves 32 and 34 were also tested with 1 mil depths and provided superior bonds as best seen in FIG. 19. Both depths, 1.5 mils and 1 mils exhibited the same bonding characteristics using similar bonding parameters but with slightly less deformation of the beam 20 on bonds made with the shallower groove. However, when the tip 32 rests against the beam 20 and ultrasonic energy is applied, the tip 32 must be properly aligned to the axis of the beam 20 to prevent the beam from twisting. This alignment also provides a maximum coupling of the ultrasonic energy.

By more efficiently coupling the ultrasonic energy to the interface between the electrical conductors 18 and 22 the parameters of pressure force and ultrasonic power could be reduced. This is desirable as excessive pressure forces cause cratering and excessive bump deformation and excessive ultrasonic power causes poor bonding.

Other and further embodiments of the bonding tool 30 may be provided having different types of patterns or configurations and in which the nonparallel surfaces extending from the end of the tip 32 may be either recessed into the end 32 of the tip or may protrude from the end 32 of the tip. In addition the tool may be of other materials such as titanium carbide.

Referring now to FIGS. 10 and 11, a tool tip 40 is best seen having an end 42 and a plurality of grooves 44 forming a double cross pattern or configuration.

Referring now to FIGS. 12 and 13, a tip 42 is provided having a circular protrusion 46 at its end 48. In this particular embodiment, the height and width of the protrusion 46 is a half of a mil.

Referring now to FIGS. 14 and 15, a tip 50 is shown having an end 52 with a plurality of grooves 54 which are straight lines and which are perpendicular to other grooves 56 which are straight lines. In this embodiment, the grooves are 1 mil in width and depth.

Figure 16:
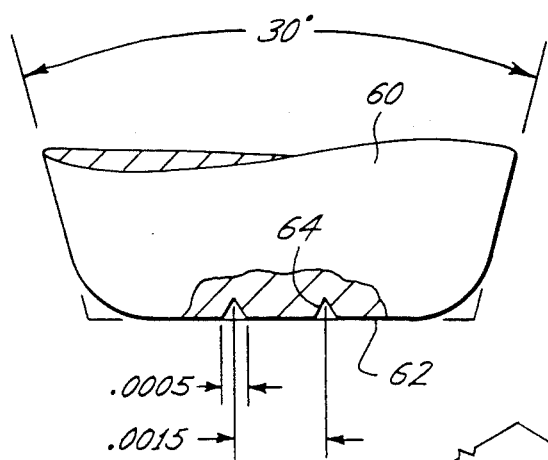
FIG. 16 is enlarged fragmentary elevational view of the tip of a still further embodiment of the present invention.
Figure 17:
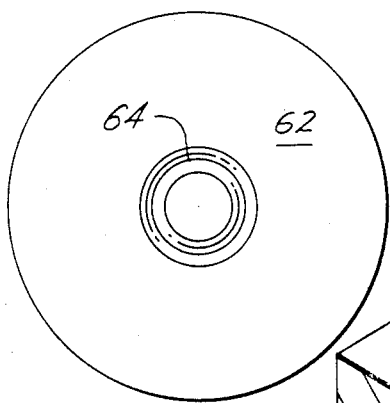
FIG. 17 is an end view of FIG. 16.

Referring now to FIGS. 16 and 17, a tip 60 is shown having an end 62 in which a circular groove 64 is provided.

Obviously, all of the foregoing patterns or configurations could be either protrusions or recesses and the depths and widths may vary, but should not substantially exceed 3 mils in order to prevent damaging of a bonding connection.

After the materials had been characterized, the equipment chosen and a bonding tip decided upon, the bonding process development started. Set up units were made to find the best bonding perimeter values. The parameters used were ultrasonic power, force, bond time, and substrate temperature. Initial bonding parameters included tip heat, however, further studies showed that ultrasonic power decreased as tip heat was increased due to the increased inductance on the ultrasonic transducer. This increase in inductance was caused by the addition of heat from the tip as well as the dampening effect on the ultrasonics of the tip's heater coil.

The heater coil that was used was 30 watts and could only heat the tip to around 275° C. A more powerful 50 watt heater coil was added and a maximum temperature of around 500° C. was obtained. However, the small mass of the heated tip in relation to the relatively large substrate mass created a heat sink effect that the tip could not overcome. This made it difficult to maintain the tip temperature even after changing to the 50 watt heater coil. Further experimentation used ultrasonic energy on the tip only.

Substrate temperature was initially chosen to be 150° C. when the materials were characterized. That is, while high heat enhances the bonding process, it undesirably accelerates the diffusion of copper through gold plating. The other initial parameter values were chosen by varying the value and bonding until the bonds visually looked acceptable and uniform. A parameter was changed and five more bonds were done until the best bond pulls were shown. Once the preliminary parameter values were established, twelve substrates were chosen, four from each substrate lot. These substrates were then cleaned in an ultrasonic degreaser with freon. Excised tape containing the die and inner lead bonded tape was then mounted using Ablebond 36-2 in the substrate cavity. The substrates were then put on a heater block at 150° C. for approximately 10 minutes to "tack" the die in the substrate without subjecting them to excess heat before bonding. These test vehicles containing 172 beams were then bonded one side at a time.

The 12 test vehicles were then bond strength characterized by doing approximately 32 destruct bond pulls before they were cured and approximately 12 destruct bond pulls after they were die mount cured at 150° C. for 1 hour. This provided documentation of the degree of degradation the curing process had on the bond strengths.

Once the test vehicles had been characterized they were put into environmental test conditions per Mil-Std-883C. The units were subjected to 4 stress tests: 85/85 per MCC Spec. 101001, high temperature storage method 1008.1, thermal shock method 1011.4 and temp cycle method 1010.5. Three test vehicles, one from each substrate group, were put into each stress test. Destruct bond pull characterization was done before curing the epoxy and after epoxy cure to determine if the heat in the cure process was detrimental to the bond strength and at intervals of 100,200,500,1000 cycles or hours. This allowed examination of the difference in plating lots of the substrates as well as degradation of bonds that may occur during environmental stressing.

In OLB, single point bonding gold beams 20 to gold pads 18 the following parameters provide satisfactory bonds: ultrasonic power 0.40 watts, contact time of 0.59 seconds, a tip contact pressure of 175 grams and a substrate heat of 150° C. Later tests reduced the contact time to 100 milliseconds.

In tests performed on ILB, the following parameters produced satisfactory bonding: ultrasonic power approximately 3 to 4 watts, contact time of 0.10 seconds, a tip contact pressure of 50 grams and a substrate heat of 150° C.

It is to be recognized that in other types of materials to be bonded, other types of machines, and other operating conditions will cause the parameters to vary.

However, utilizing a single point bonding tool such as shown in FIGS. 7-9, the following parameters are preferred:

(1) Power up to approximately 10 watts to the horn of the ultrasonic transducer;
(2) Tip pressure for bonding—about 10 to about 300 grams;
(3) Tip contact time—about 10 milliseconds to about 500 milliseconds; and
(4) Temperature of the substrate—about room temperature (25° C.) up to about 300° C.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and which are encompassed within the spirit of the invention and the scope of the appended claims:

What is claimed is:

1. In a single point bonding machine, for bonding a flat surface of one electrical conductor to a flat surface of a second electrical conductor, having an ultrasonic generator and means for forcing a tip of a bonding tool into contact with one of the conductors, the improvement in a bonding tool comprising,
    said tool having a tip having a flat contacting end with multiple non-parallel surfaces located on the flat end of the tip, wherein the surfaces protrude outwardly from the end of the tip.

2. In a single point bonding machine, for bonding a flat surface of one electrical conductor to a flat surface of a second electrical conductor, having an ultrasonic generator and means for forcing a tip of a bonding tool into contact with one of the conductors, the improvement in a bonding tool comprising,
    said tool having a tip having a flat contacting end with multiple non-parallel surfaces located on the flat end of the tip, wherein the surfaces are in the shape of a cross.

3. In a single point bonding machine, for bonding a flat surface of one electrical conductor to a flat surface of a second electrical conductor, having an ultrasonic generator and means for forcing a tip of a bonding tool into contact with one of the conductors, the improvement in a bonding tool comprising, said tool having a tip having a flat contacting end with multiple non-parallel surfaces located on the flat end of the tip, wherein the surfaces are recessed into the end of the tip, and said surfaces are in the shape of a cross.

4. In a single point bonding machine, for bonding a flat surface of one electrical conductor to a flat surface of a second electrical conductor, having an ultrasonic generator and means for forcing a tip of a bonding tool into contact with one of the conductors, the improvement in a bonding tool comprising, said tool having a tip having a flat contacting end with multiple non-parallel surfaces located on the flat end of the tip, wherein the surfaces are recessed into the end of the tip, wherein the surfaces are in the shape of a circle.

5. The apparatus of claim 1 wherein the surfaces are in the shape of a circle.

6. In a single point bonding machine, for bonding a flat surface of one electrical conductor to a flat surface of a second electrical conductor, having an ultrasonic generator and means for forcing a tip of a bonding tool into contact with one of the conductors, the improvement in a bonding tool comprising, said tool having a tip having a flat contacting end with multiple non-parallel surfaces located on the flat end of the tip, wherein the surfaces are a plurality of straight lines perpendicular to other straight lines.

7. A process for ultrasonically bonding one flat electrical conductor to a second flat electrical conductor for tape automated bonding by means of a single point bonding tool having a tip having a flat contacting surface with a multiple non-parallel pattern on the surface of the tip wherein the surfaces protrude outwardly from the end of the tip comprising, placing one of the conductors on the second conductor, forcing the tip into contact with one of the conductors with a tip contact pressure of from about 10 to about 300 grams for a contact time of from about 10 milliseconds to about 500 milliseconds, coupling ultrasonic energy of up to ten watts to the tool, and in which the temperature of the conductors is from about 25° C. up to about 300° C.

* * * * *